(12) United States Patent
Liu et al.

(10) Patent No.: US 12,148,653 B2
(45) Date of Patent: Nov. 19, 2024

(54) METHOD OF MANUFACTURING SEMICONDUCTOR DEVICES

(71) Applicant: TAIWAN SEMICONDUCTOR MANUFACTURING COMPANY, LTD., Hsinchu (TW)

(72) Inventors: Ru-Gun Liu, Zhubei (TW); Chin-Hsiang Lin, Hsinchu (TW); Chih-Ming Lai, Hsinchu (TW); Wei-Liang Lin, Hsinchu (TW); Yung-Sung Yen, New Taipei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 566 days.

(21) Appl. No.: 17/316,555

(22) Filed: May 10, 2021

(65) Prior Publication Data
US 2021/0280455 A1 Sep. 9, 2021

Related U.S. Application Data

(63) Continuation of application No. 16/374,150, filed on Apr. 3, 2019, now Pat. No. 11,004,729.
(Continued)

(51) Int. Cl.
*H01L 21/76* (2006.01)
*H01L 21/768* (2006.01)
*H01L 27/12* (2006.01)

(52) U.S. Cl.
CPC .. *H01L 21/76805* (2013.01); *H01L 21/76814* (2013.01); *H01L 21/76877* (2013.01); *H01L 27/127* (2013.01)

(58) Field of Classification Search
CPC ......... H01L 21/76805; H01L 21/76877; H01L 21/76816; H01L 21/7681; H01L 21/76807
See application file for complete search history.

(56) References Cited

U.S. PATENT DOCUMENTS 7,638,398 B2 12/2009 Cho
7,887,979 B2 * 2/2011 Kim .......................... G03F 1/29
430/5
(Continued)

FOREIGN PATENT DOCUMENTS

JP H0923003 A 1/1997
JP 2005-159264 A 6/2005
(Continued)

OTHER PUBLICATIONS

Non-Final Office Action issued in U.S. Appl. No. 16/374,150, dated Nov. 16, 2020.
(Continued)

*Primary Examiner* — Vu A Vu
*Assistant Examiner* — Valerie N Newton
(74) *Attorney, Agent, or Firm* — STUDEBAKER & BRACKETT PC

(57) ABSTRACT

In accordance with an aspect of the present disclosure, in a pattern forming method for a semiconductor device, a first opening is formed in an underlying layer disposed over a substrate. The first opening is expanded in a first axis by directional etching to form a first groove in the underlying layer. A resist pattern is formed over the underlying layer. The resist pattern includes a second opening only partially overlapping the first groove. The underlying layer is patterned by using the resist pattern as an etching mask to form a second groove.

20 Claims, 17 Drawing Sheets

Related U.S. Application Data

(60) Provisional application No. 62/690,829, filed on Jun. 27, 2018.

(56) References Cited

U.S. PATENT DOCUMENTS

| | | |
|---|---|---|
| 9,257,297 B2 | 2/2016 | Gwak |
| 9,548,366 B1* | 1/2017 | Ho ................. H01L 21/823475 |
| 2014/0187035 A1* | 7/2014 | Posseme ........... H01L 21/31144 |
| | | 438/723 |
| 2014/0264895 A1* | 9/2014 | Sung .................. H01L 23/5226 |
| | | 257/773 |
| 2014/0273424 A1 | 9/2014 | Liu et al. |
| 2014/0300000 A1* | 10/2014 | Chao ................... H01L 23/5226 |
| | | 257/774 |
| 2015/0262873 A1* | 9/2015 | Chu ................. H01L 23/53295 |
| | | 257/773 |
| 2017/0338115 A1* | 11/2017 | Yen .................. H01L 21/76802 |
| 2018/0090370 A1* | 3/2018 | Hung ................ H01L 21/31144 |
| 2020/0006078 A1 | 1/2020 | Liu et al. |

FOREIGN PATENT DOCUMENTS

| | | |
|---|---|---|
| KR | 100199051 B1 | 6/1999 |
| KR | 10-2014-0073165 A | 6/2014 |
| KR | 10-2014-0113299 A | 9/2014 |

OTHER PUBLICATIONS

Notice of Allowance issued in U.S. Appl. No. 16/374,150, dated Jan. 25, 2021.

* cited by examiner

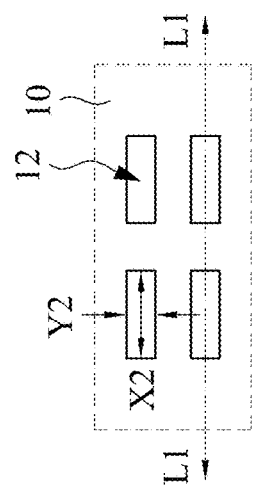
FIG. 4A
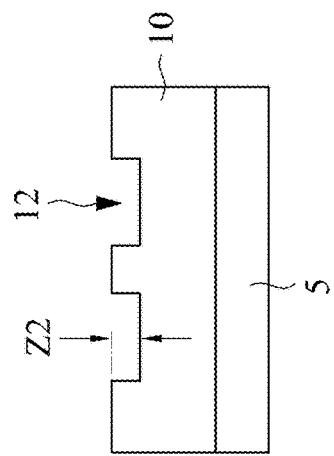
FIG. 4B
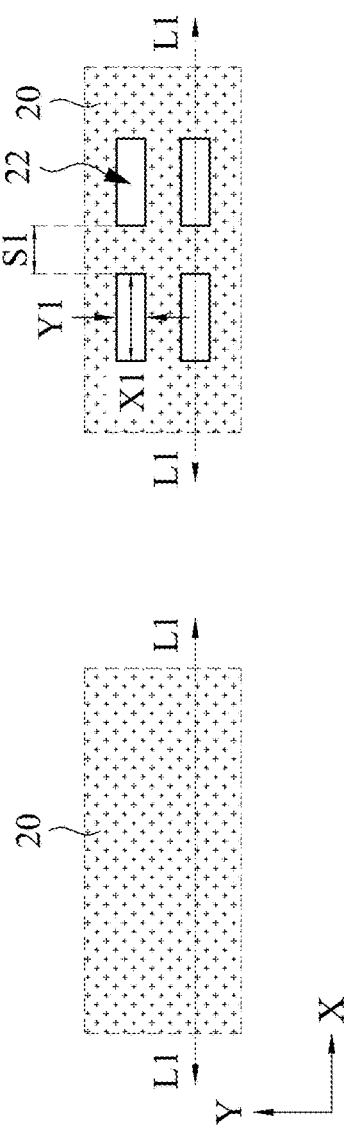
FIG. 3A
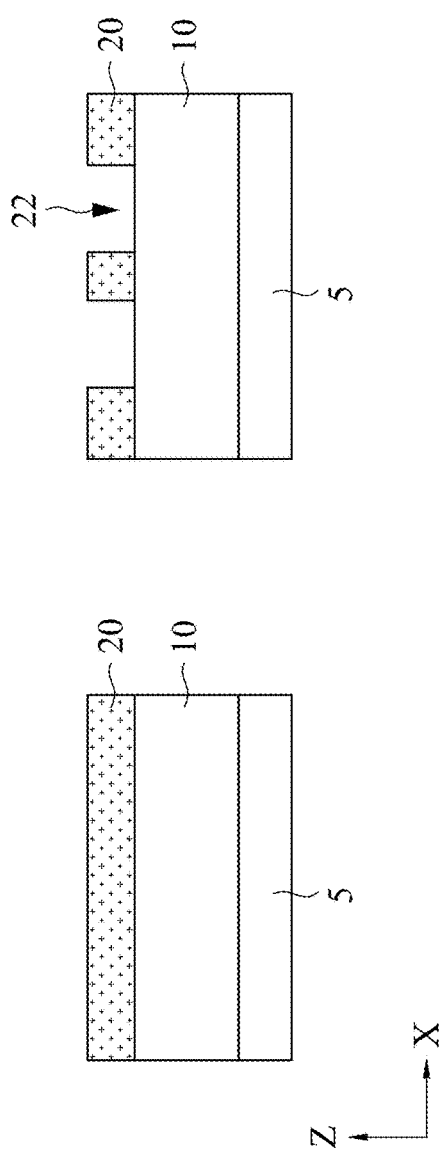
FIG. 3B
FIG. 2A
FIG. 2B

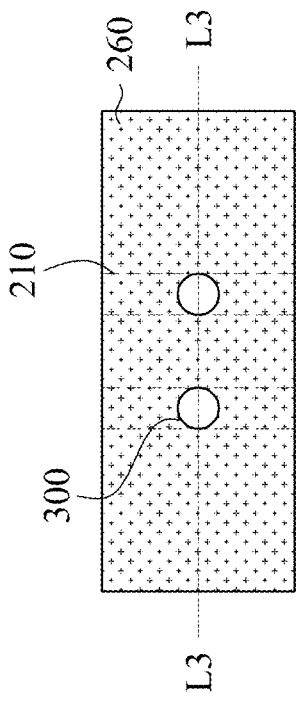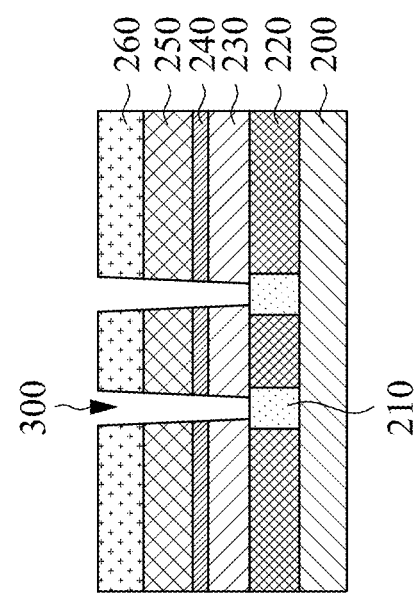
FIG. 13A  FIG. 14A
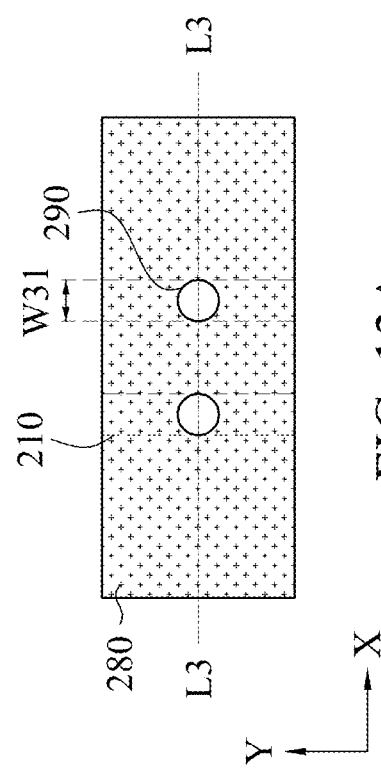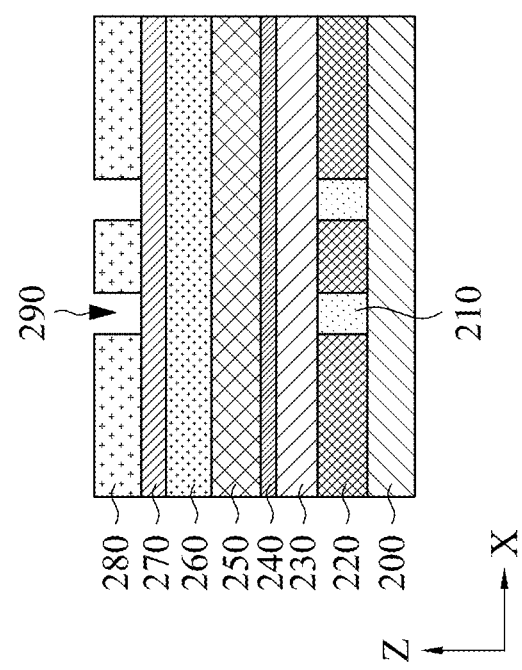
FIG. 13B  FIG. 14B

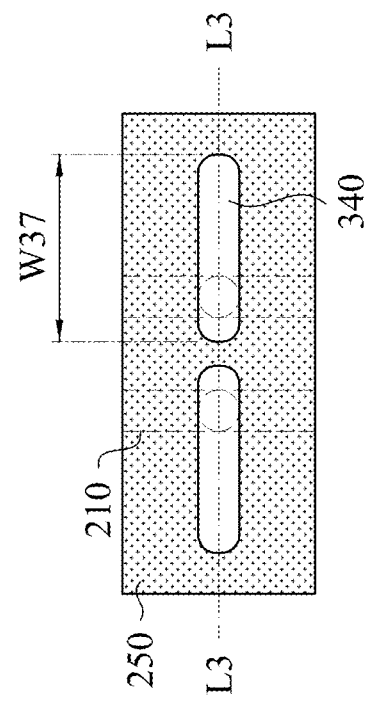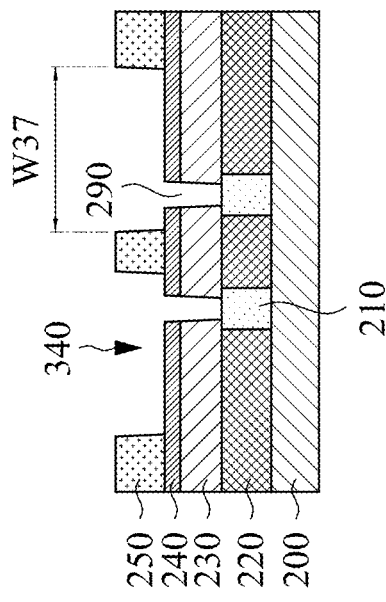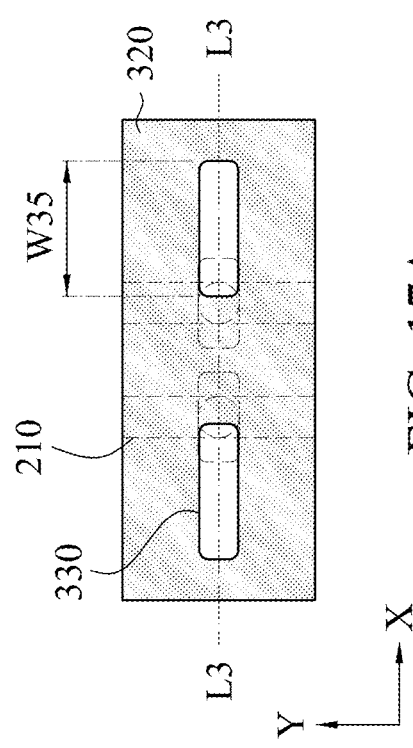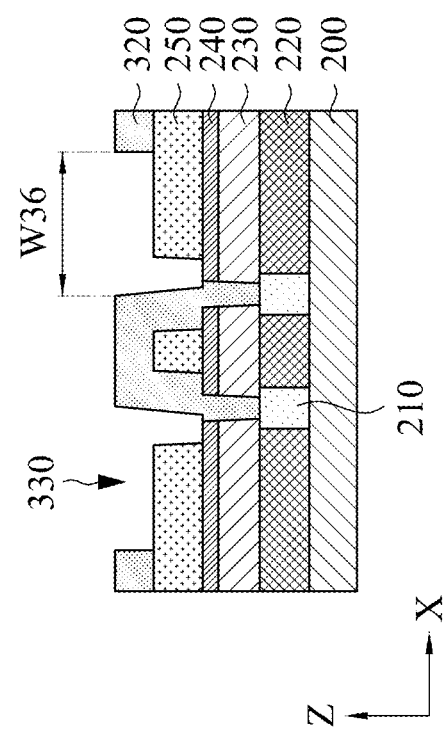

US 12,148,653 B2

METHOD OF MANUFACTURING SEMICONDUCTOR DEVICES

RELATED APPLICATIONS

This application is continuation of U.S. patent application Ser. No. 16/374,150 filed Apr. 3, 2019, which claims priority to U.S. Provisional Patent Application No. 62/690,829 filed Jun. 27, 2018, the entire disclosure of each of which is incorporated herein by reference.

TECHNICAL FIELD

The disclosure relates to methods of manufacturing semiconductor integrated circuits, and more particularly to a method of manufacturing narrow trench or opening patterns with a dimension smaller than a lithography resolution limit.

BACKGROUND

At semiconductor technology nodes of 7 nm or smaller, line-and-space (L/S) patterning requires pitch resolution in optical lithography smaller than about 32 nm. In general, even if extreme ultra violet (EUV) lithography is employed, the resolution limitation by EUV single-exposure technology (SPT) is about 28 nm to about 34 nm. To obtain smaller pitch patterns, a double-patterning technology (DPT) with twice repeating lithography exposure processes will be needed for patterning of a L/S pitch smaller than about 32 nm. However, the cost of EUV with the DPT approach would be too expensive for a mass-production application.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A illustrates a plan view of one of the various stages of manufacturing operations in accordance with an embodiment of the present disclosure. FIG. 2B illustrates a cross sectional view corresponding to line L1-L1 of FIG. 2A.

FIG. 3A illustrates a plan view of one of the various stages of manufacturing operations in accordance with an embodiment of the present disclosure. FIG. 3B illustrates a cross sectional view corresponding to line L1-L1 of FIG. 3A.

FIG. 4A illustrates a plan view of one of the various stages of manufacturing operations in accordance with an embodiment of the present disclosure. FIG. 4B illustrates a cross sectional view corresponding to line L1-L1 of FIG. 4A.

FIG. 13A illustrates a plan view of one of the various stages of manufacturing operations in accordance with an embodiment of the present disclosure. FIG. 13B illustrates a cross sectional view corresponding to line L3-L3 of FIG. 13A.

FIG. 14A illustrates a plan view of one of the various stages of manufacturing operations in accordance with an embodiment of the present disclosure. FIG. 14B illustrates a cross sectional view corresponding to line L3-L3 of FIG. 14A.

FIG. 17A illustrates a plan view of one of the various stages of manufacturing operations in accordance with an embodiment of the present disclosure. FIG. 17B illustrates a cross sectional view corresponding to line L3-L3 of FIG. 17A.

FIG. 18A illustrates a plan view of one of the various stages of manufacturing operations in accordance with an embodiment of the present disclosure. FIG. 18B illustrates a cross sectional view corresponding to line L3-L3 of FIG. 18A.

DETAILED DESCRIPTION

Figure 1A:
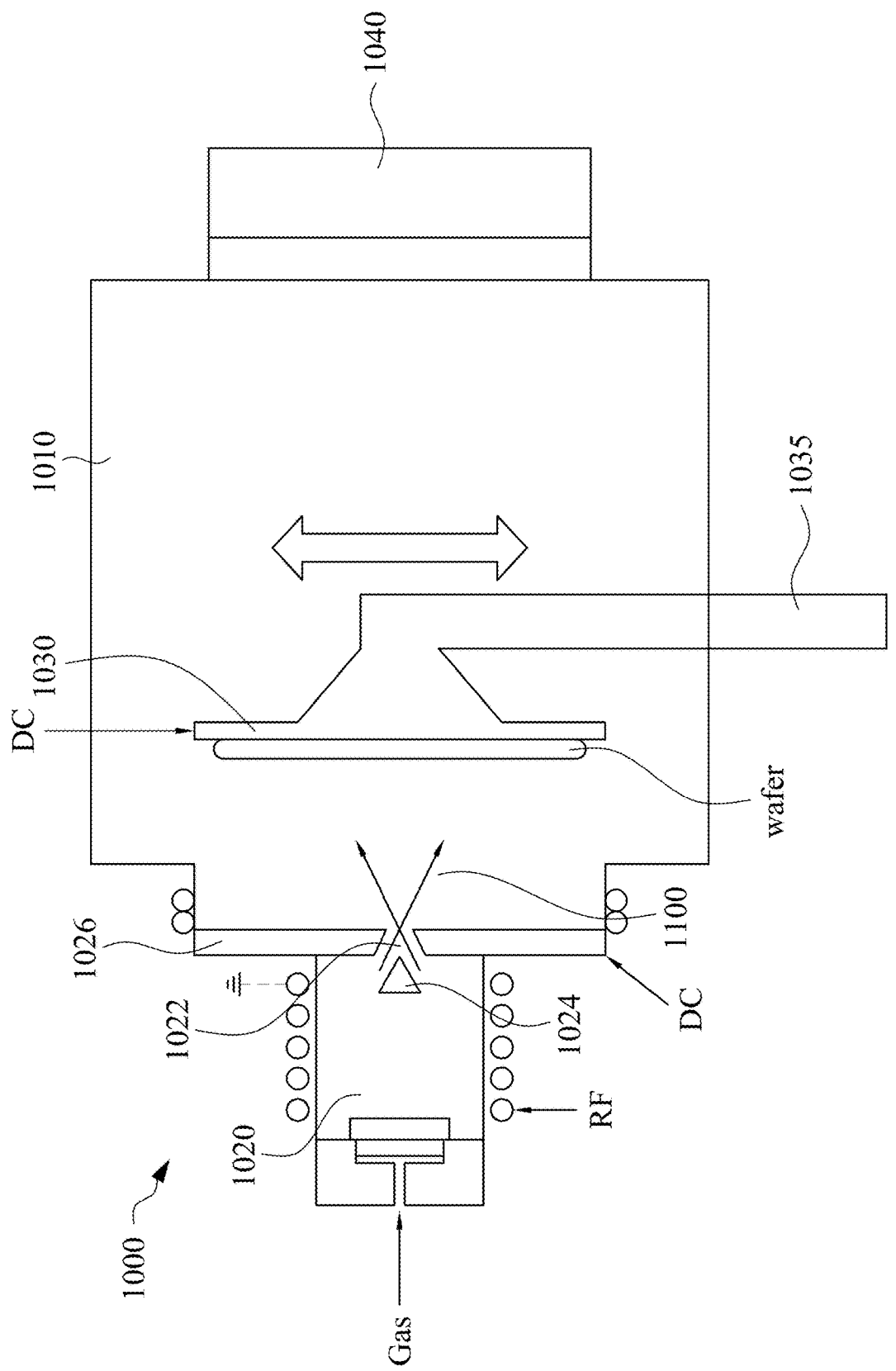
FIG. 1A shows a schematic view of a directional patterning apparatus in accordance with an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations inbetween the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

Disclosed embodiments relate to a semiconductor device, in particular, a complementary metal-oxide-semiconductor field effect transistor (CMOS FET), for example, a fin field effect transistor (FinFET) and its manufacturing method. The embodiments such as those disclosed herein are generally applicable not only to FinFETs but also to a planar FET, a double-gate FET, a surround-gate FET, an omega-gate FET or gate-all-around (GAA) FET, and/or a nanowire FET, or any suitable device having a three-dimensional channel structure.

In the present disclosure, a directional patterning technique using a single-exposure patterning technology (SPT) will be explained to obtain a pattern pitch smaller than the lithography resolution limit, e.g., smaller than about 32 nm.

A directional patterning technique includes a directional etching technique and a directional deposition technique. The directional etching can be characterized as horizontal or surface anisotropic or selective etching, in which a target layer or pattern is etched in substantially only one direction (e.g., X direction) within a plane (X-Y plane) parallel to a substrate, without substantially etching another direction (e.g., Y direction).

A directional etching can be performed by tuning various etching parameters to generate etching species (free radicals) that travel in a substantially horizontal direction or that are incident on the substrate with a large incident angle of more than about 10-30 degrees (where the angle of 90 degrees is horizontal). The etching parameters to be tuned include, but are not limited to, etchant (gas) composition, etching temperature, etching time, etching pressure, radio frequency (RF) bias voltage, RF bias power, etchant flow rate, wafer tilting, other suitable etching parameters, or combinations thereof.

Figure 1C:
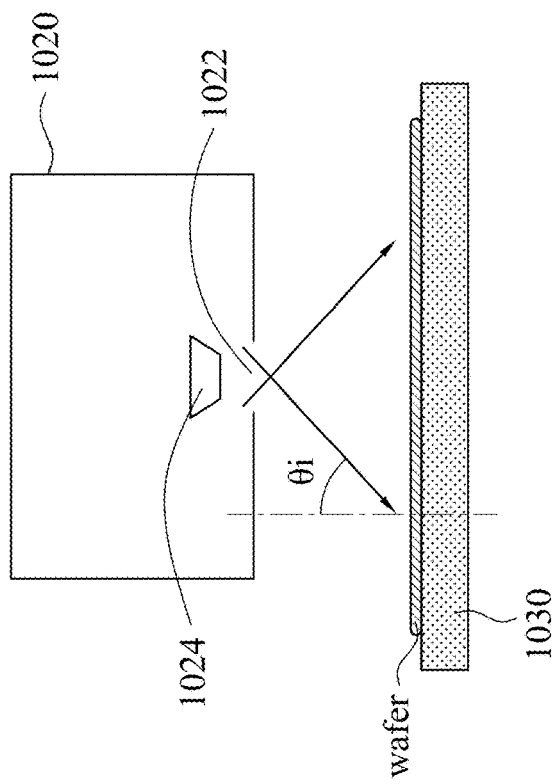
FIGS. 1B, 1C and 1D show schematic views of directional patterning in accordance with an embodiment of the present disclosure.
Figure 1B:
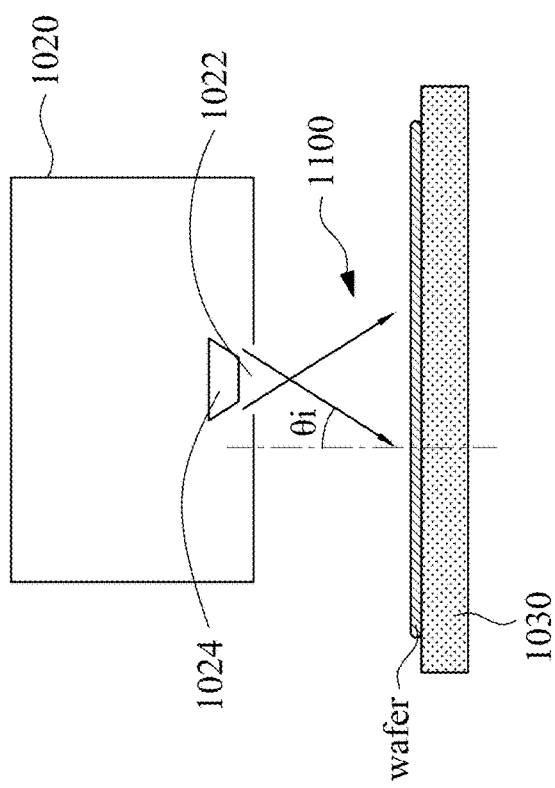
Figure 1D:
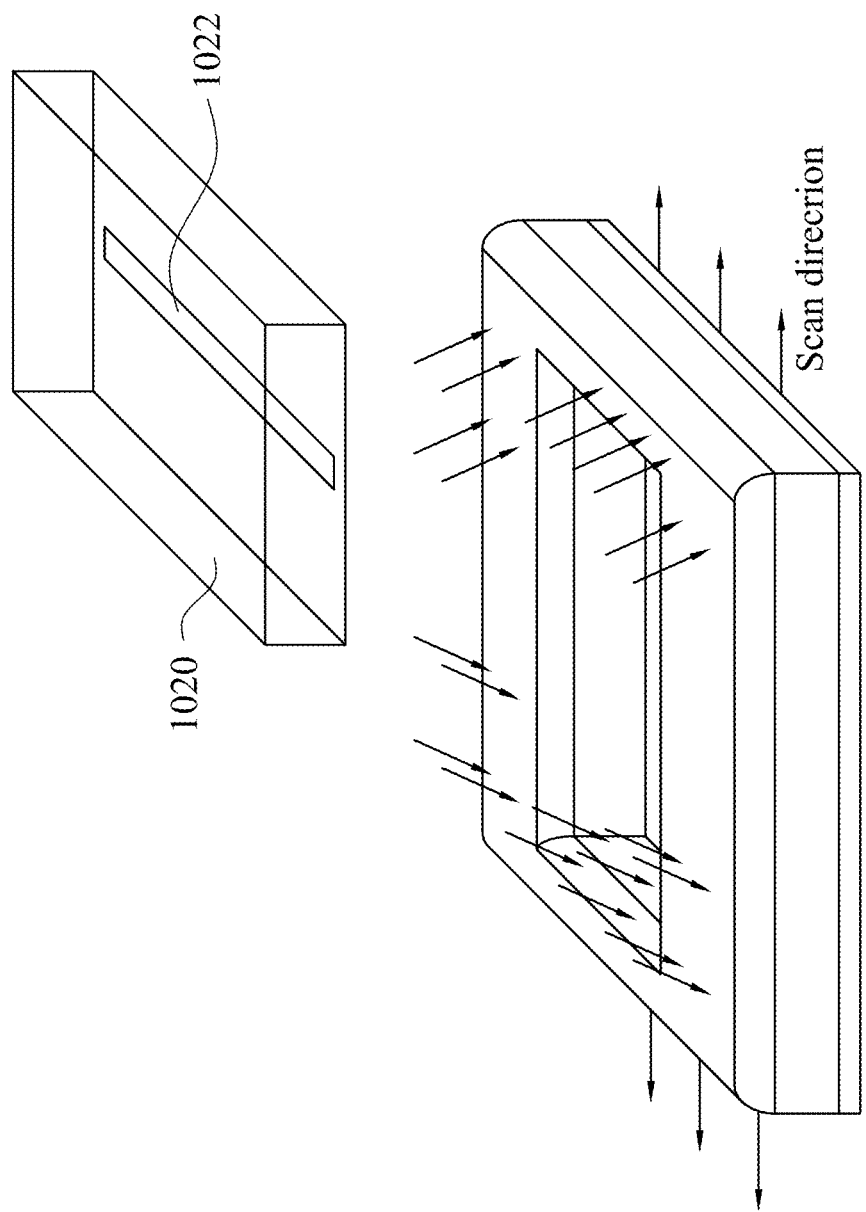

FIG. 1A shows a schematic view of a directional patterning apparatus, and FIGS. 1B, 1C and 1D show schematic views of directional patterning in accordance with an embodiment of the present disclosure.

As shown in FIG. 1A, the directional patterning apparatus, for example, a directional etching apparatus 1000 includes a main chamber 1010 in which a wafer stage 1030 for a wafer to be processed is disposed, and a plasma generation chamber 1020 for generating plasma. In some embodiments, the plasma is RF (radio frequency) generated plasma, using a high frequency power supply at 13.56 MHz and/or 2.45 GHz. Other frequency ranges may be used. A separation plate 1026 is disposed between the main chamber 1010 and the plasma chamber 1020. The separation plate 1026 includes a slit 1022 from which plasma beams 1100 are introduced into the main chamber. In some embodiments, an adjustable meniscus 1024 is provided over the slit 1022 in the plasma chamber side. One or more vacuum systems 1040 including, for example, a turbo molecular pump, is coupled to the main chamber and to the plasma chamber (not shown) to maintain reduced pressure states in the chambers. In some embodiments, during the etching process, the pressure in the main chamber is lower than the pressure in the plasma chamber. In certain embodiments, the pressure in the main chamber is on the order of $1\times10^{-5}$ Torr, and the pressure in the plasma chamber is on the order of $1\times10^{-3}$ Torr.

In some embodiments, the separation plate 1026 and the wafer stage 1030 are biased by DC voltage, respectively, to extract and control the plasma beams 1100. Further, the wafer stage 1030 is movable by a moving mechanism 1035 to scan the wafer relative to the plasma beams 1100.

In some embodiments, at least one of RF and DC bias voltages is tuned to achieve an electric field that causes etching species to flow substantially horizontally along an in-plane direction (for example, in the X direction) relative to a surface over the substrate, or to provide a large incident angle. In some embodiments, the etching species are tuned to have a profile of momenta of the energetic species such that the momenta of the etching species or energetic species along a frontline are not the same, i.e., the momentum of an etching or energetic species on the top path is different from the momentum of an etching or energetic species on the bottom path. In some embodiments, the momentum of an etching or energetic species on the top path is different from the momentum of an etching or energetic species in the middle path above the bottom path, and the momentum of the etching or energetic species on the top path is the same as or different from the momentum of an etching or energetic species on the bottom path. Any combinations can be achieved by adjustment of the electromagnetic control to tune the energies of the etching or energetic species along the etching front.

In some embodiments, as shown in FIGS. 1B and 1C, a position of the meniscus 1024 is adjusted to change the incident angle θi of the plasma beams 1100. As shown in FIG. 1D, by scanning the wafer along the X direction, a groove pattern can be formed without substantially expanding the groove in the Y direction.

In some embodiments, a ratio of an amount of etching in the X direction to an amount of etching in the Y direction is about 2 or more, and is about 5 or more in other embodiments. In certain embodiments, the ratio is about 10 or more. Ideally, the ratio is as high as possible, but it can be up to about 50 in some embodiments and up to about 100 in other embodiments. Further, an amount of etching along the Z direction (vertical direction) is smaller than the amount of etching in the X direction. In some embodiments, a ratio of an amount of etching in the X direction to an amount of etching in the Z direction is about 2 or more, and is about 5 or more in other embodiments. In certain embodiments, the ratio is about 10 or more. Ideally, the ratio is as high as possible, but it can be up to about 50 in some embodiments and up to about 100 in other embodiments.

FIGS. 2A-6B shows plan views and cross sectional views of various stages for manufacturing a semiconductor device in accordance with an embodiment of the present disclosure. It is understood that additional operations can be provided before, during, and after processes shown by FIGS. 2A-6B, and some of the operations described below can be replaced or eliminated, for additional embodiments of the method. The order of the operations/processes may be interchangeable. In FIGS. 2A-6B, the "A" figures are plan views (viewed from the above) and the "B" figures are cross sectional views corresponding to line L1-L1 of FIGS. 1A-3A.

As shown in FIGS. 2A and 2B, a mask pattern 20 is formed over a target layer 10. In some embodiments, the target layer 10 is formed over a substrate 5. In some embodiments, the substrate 5 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 100 may include an epitaxial layer (epi-layer), which may be strained for performance enhancement, and/or may include a silicon-on-insulator (SOI) structure. In one embodiment, a p-type silicon substrate is used.

The target layer 10 is one or more layers of a conductive material and/or a dielectric material. In some embodiments, the target layer 10 includes a dielectric material, such as silicon oxide, silicon nitride, SiON, SiOC, SiOCN, SiCN, aluminum based dielectric material, low-k material, organic material, or any other dielectric material used in a semiconductor device fabrication. In one embodiment, a silicon oxide is used.

The mask layer 20 is a photo resist layer in some embodiments, and can be a hard mask layer made of different material than the target layer 10 in other embodiments.

Then, as shown in FIGS. 3A and 3B, the photo resist layer 20 is patterned by using a lithography operation including resist developing. As shown in FIGS. 3A and 3B, opening patterns (spaces or tranches) 22 are formed in the photo resist layer 20. In some embodiments, the lithography operation is a single exposure patterning process using one of an EUV light source, an electron beam, an ArF laser light source or a KrF laser light source. As shown in FIG. 3A, the opening 22 has a length X1 (the maximum length) along the X direction and a width Y1 (the maximum width) along the Y direction. In some embodiments, X1 is greater than Y1. As shown in FIG. 3A, two adjacent openings 22 are separated by a distance S1, which is equal to or greater than the resolution limit of a single exposure lithography operation.

Then, one or more etching operations are performed to etch a surface portion of the target layer 10 to form trenches 12, and then the mask layer 20 is removed, as shown in FIGS. 4A and 4B. The etching operations include dry etching and/or wet etching. As shown in FIGS. 4A and 4B, the trench 12 has a length X2, a width Y2 and a depth Z2 along the Z direction.

Figure 5A:
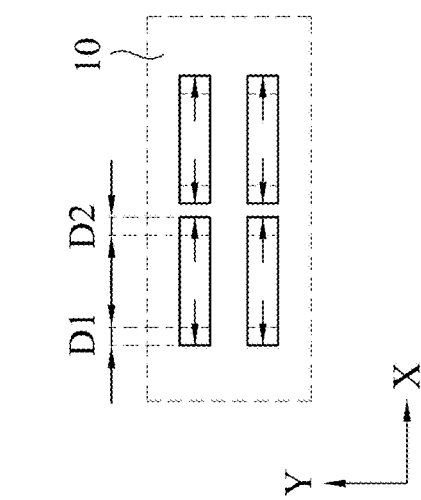
FIG. 5A illustrates a plan view of one of the various stages of manufacturing operations in accordance with an embodiment of the present disclosure.
Figure 5B:
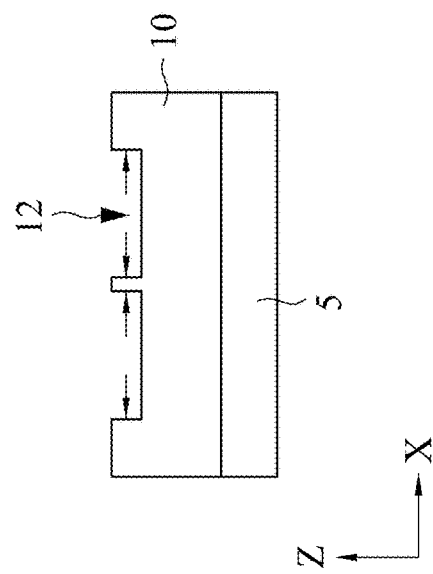
FIG. 5B illustrates a cross sectional view corresponding to line L1-L1 of FIGS. 2A-4A.

Next, as shown in FIGS. 5A and 5B, one or more directional etching operations are performed to selectively etch the left edges and the right edges (short sides) of the trenches 12. By the directional etching in the X direction, the left and right edges of the trenches 12 are etched by an amount D1 and D2, respectively. In the directional etching, the bottoms of the trenches 12, the long sides of the trenches 12 and/or the right edges of the trenches 12 are also slightly etched in some embodiments. In some embodiments, D1 is equal to D2 and in other embodiments, D1 is different from D2.

Figure 6A:
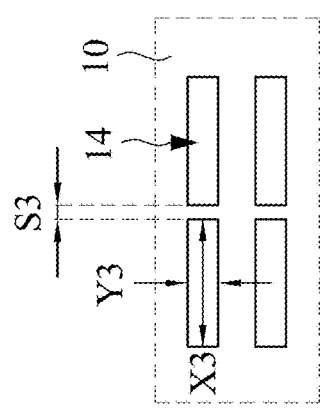
FIG. 6A illustrates a plan view of one of the various stages of manufacturing operations in accordance with an embodiment of the present disclosure.
Figure 6B:
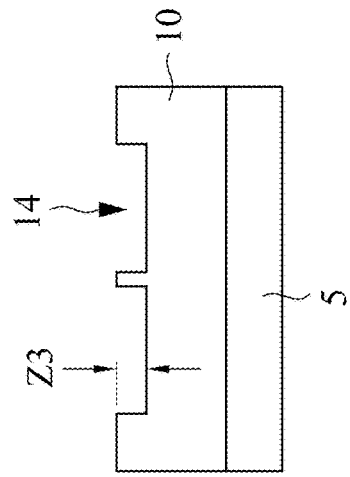
FIG. 6B illustrates a cross sectional view corresponding to line L1-L1 of FIGS. 2A-4A.

By the one or more directional etching operations, modified trenches 14 as shown in FIGS. 6A and 6B can be obtained. As shown in FIGS. 6A and 6B, the modified trench 14 has a length X3, a width Y3 and a depth Z3 along the Z direction. The length X3 is equal to X2+D1+D2. The difference Dy between widths Y3 and Y2 is equal to or greater than zero and smaller than (D1+D2)/2. In some embodiments, (D1+D2)/2 is two times or more, five times or more, or ten times or more Dy. In some embodiments, Z3 is greater than Z2 and ½ or less, ⅕ or less or 1/10 or less (D1+D2)/2. After the directional etching operations, a space S3 between adjacent trenches in the X direction can be smaller than the resolution limit of the single exposure lithography operation.

FIGS. 7A-9B shows plan views and cross sectional views of various stages for manufacturing a semiconductor device in accordance with another embodiment of the present disclosure. It is understood that additional operations can be provided before, during, and after processes shown by FIGS. 7A-9B, and some of the operations described below can be replaced or eliminated, for additional embodiments of the method. The order of the operations/processes may be interchangeable. In FIGS. 7A-9B, the "A" figures are plan views (viewed from above) and the "B" figures are cross sectional views corresponding to line L2-L2 of FIG. 7A. Materials, configurations, dimensions, structures, conditions and operations the same as or similar to those explained with respect to FIGS. 1A-6B may be employed in the following embodiments, and some of the explanations may be omitted.

Figure 7A:
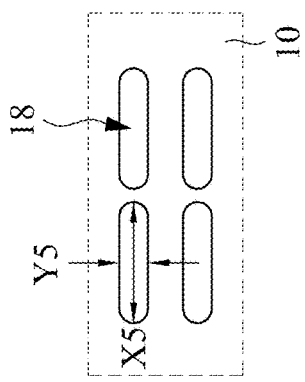
FIG. 7A illustrates a plan view of one of the various stages of manufacturing operations in accordance with an embodiment of the present disclosure.
Figure 7B:
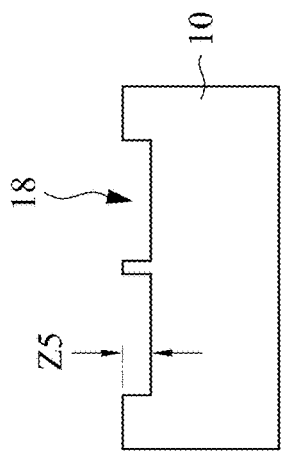
FIG. 7B illustrates a cross sectional view corresponding to line L2-L2 of FIG. 7A.
Figure 8A:
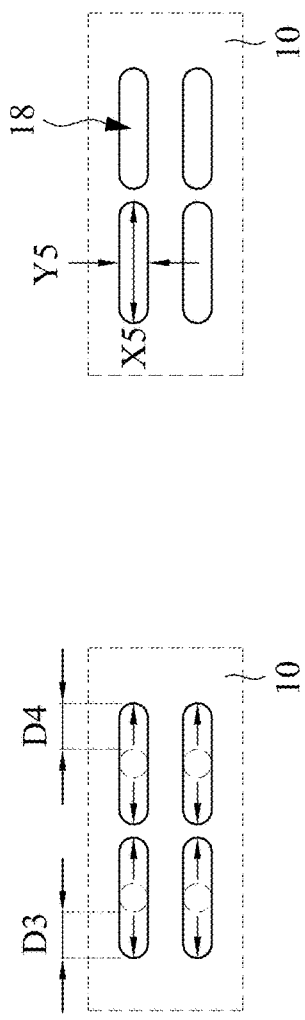
FIG. 8A illustrates a plan view of one of the various stages of manufacturing operations in accordance with an embodiment of the present disclosure.
Figure 8B:
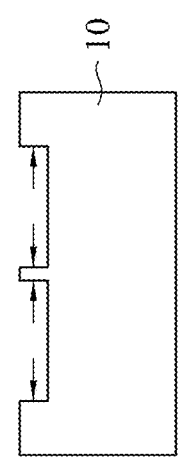
FIG. 8B illustrates a cross sectional view corresponding to line L2-L2 of FIG. 7A.
Figure 9A:
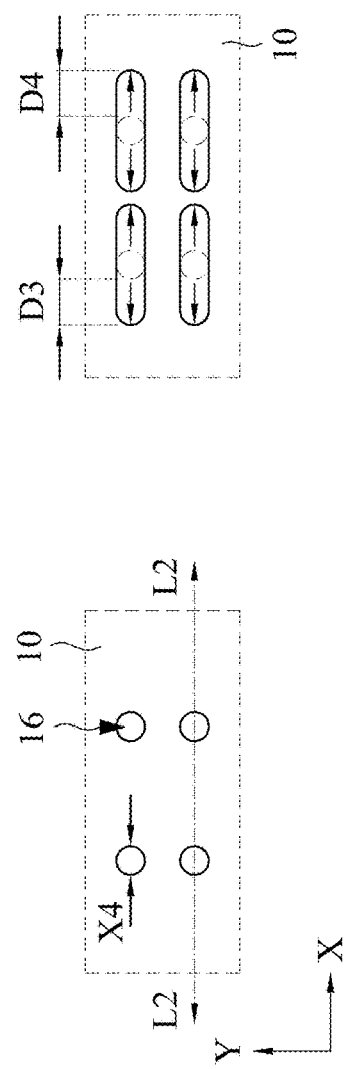
FIG. 9A illustrates a plan view of one of the various stages of manufacturing operations in accordance with an embodiment of the present disclosure.
Figure 9B:
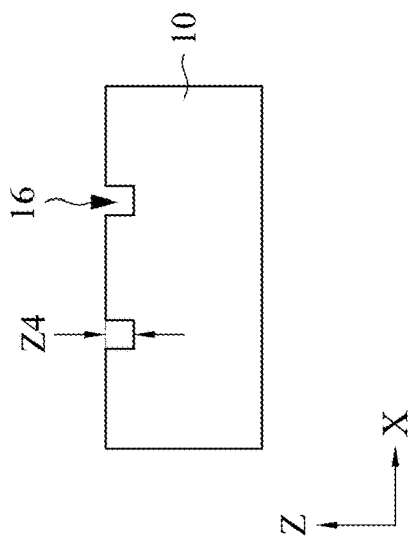
FIG. 9B illustrates a cross sectional view corresponding to line L2-L2 of FIG. 7A.

In this embodiment, hole patterns 16 are formed in the surface portion of the target layer 10, by operations similar to those explained with respect to FIGS. 2A-4B. The hole pattern 16 has a diameter X4 and a depth Z4, as shown in FIG. 7B. Then, similar to FIGS. 5A and 5B, one or more directional etching operations in the X direction are performed, to enlarge the hole patterns 16 by an amount D3 and an amount D4, thereby forming trenches 18, as shown in FIGS. 8A and 8B and FIGS. 9A and 9B. In some embodiments, D3 is equal to D4 and in other embodiments, D3 is different from D4. Similar to FIGS. 6A and 6B, the trench 18 has a length X5, a width Y5 and a depth Z5, as shown in FIGS. 9A and 9B. The length X5 is equal to X4+D3+D4. The difference Dy between widths Y5 and X4 is equal to or greater than zero and smaller than (D3+D4)/2. In some embodiments, (D3+D4)/2 is two times or more, five times or more, or ten times or more Dy. In some embodiments, Z5 is greater than Z4 and ½ or less, ⅕ or less or 1/10 or less (D3+D4)/2.

FIGS. 10A-10D shows plan views or layout of a semiconductor device in accordance with another embodiment of the present disclosure. Materials, configurations, dimensions, structures, conditions and operations the same as or similar to those explained with respect to FIGS. 1A-9B may be employed in the following embodiments, and some of the explanations may be omitted. In some embodiments, FIGS. 10A-10D correspond to manufacturing operations for via/contact holes and metal wirings.

Figure 10D:
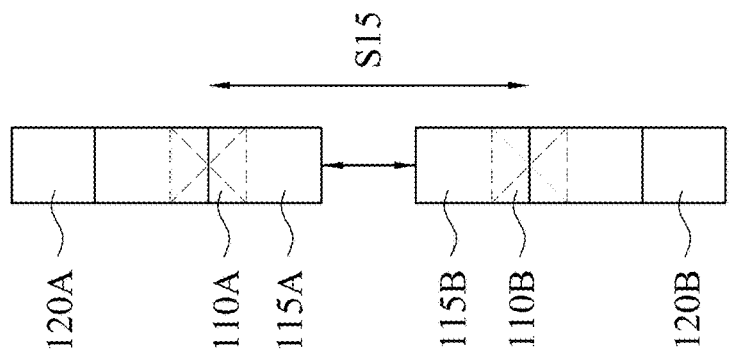
FIGS. 10A, 10B, 10C and 10D illustrate layout designs or plan views of a semiconductor device in accordance with an embodiment of the present disclosure.
Figure 10C:
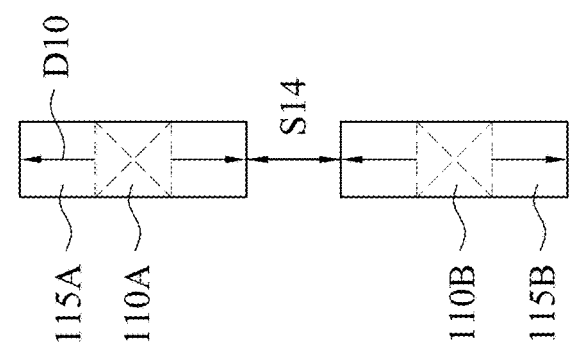
Figure 10B:
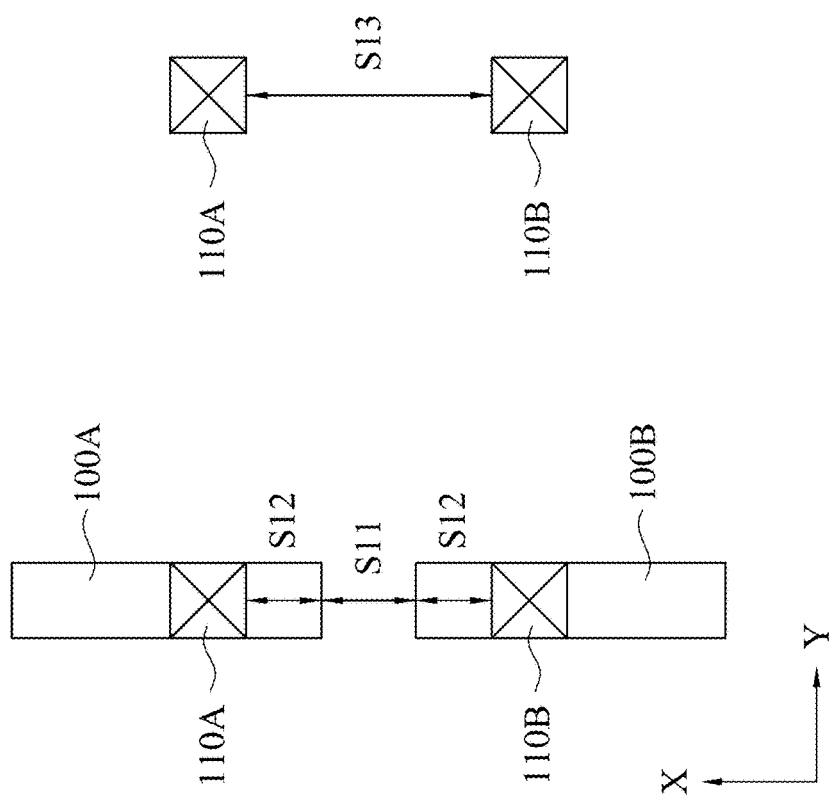
Figure 10A:
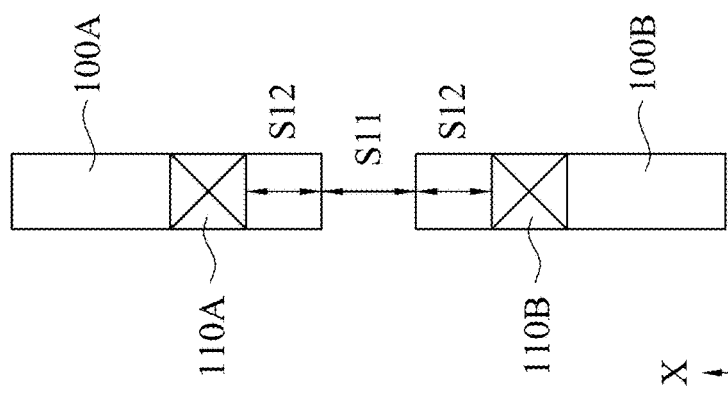

FIG. 10A shows a design layout of a semiconductor device to be manufactured. Patterns 100A and 100B are conductive wiring patterns extending in the X direction, and patterns 110A and 110B are contact or via holes connecting lower conductive patterns (not shown) and upper conductive patterns 100A and 100B. The wiring patterns 100A and 100B are separated with a space S11 and an end of the wiring patterns 100A and 100B are spaced apart from the via holes 110A and 110B by an amount S12, respectively. In some embodiments, the space S11 is smaller than the resolution limit of a single exposure lithography operation. In certain embodiments, space S11 is in a range from about 15 nm to about 25 nm. In some embodiments, the space S12 is in a range from about 5 nm to about 15 nm. The size of the via holes 110A and 110B is in a range from about 10 nm×10 nm to about 20 nm×20 nm in some embodiments. The width of the wiring patterns 100A and 100B in the Y direction is in a range from about 10 nm to about 20 nm in some embodiments.

As shown in FIG. 10B, the via holes 110A and 110B are spaced apart from each other by an amount S13, which is equal to S11+2×S12. The space S13 is equal to or greater than resolution limit of a single exposure lithography operation. Accordingly, the via holes 110A and 110B can be patterned at the same time by a single exposure lithography operation.

Then, after the via holes 110A and 110B are formed in an underlying layer, the via holes 110A and 110B are expanded along the X direction by one or more directional etching operations as set forth above. In the directional etching operation, the via holes 110A and 110B are expanded by an amount D10 (one direction) as shown in FIG. 10C, thereby first groove patterns 115A and 115B are formed. The length of the groove patterns 115A and 115B in the X direction is about a sum of the size of the via holes and 2×D10. The directional etching is performed such that the space S14 between the adjacent groove patterns 115A and 115B is desired size S11.

Next, second groove patterns 120A and 120B are formed over the first groove patterns 115A and 115B, as shown in FIG. 10D. The second groove patterns 120A and 120B are spaced apart from each other by an amount S15, which is equal to or greater than resolution limit of a single exposure lithography operation. Accordingly, the second groove patterns 120A and 120B can be patterned at the same time by a single exposure lithography operation.

By the foregoing operations, the first grooves 115A and 115B and the second grooves 120A and 120B are connected to form trenches corresponding to wiring patterns 100A and 100B, respectively. Thus, trench patterns for wiring patterns 110A and 110B spaced apart from each other by S11 smaller than the resolution limit of a single exposure lithography operation can be obtained without using double patterning or one or more additional lithography operations.

FIGS. 11A-19B shows plan views and cross sectional views corresponding to FIGS. 10A-10D of various stages for manufacturing a semiconductor device in accordance with another embodiment of the present disclosure. It is understood that additional operations can be provided before, during, and after processes shown by FIGS. 11A-19B, and some of the operations described below can be replaced or eliminated, for additional embodiments of the method. The order of the operations/processes may be interchangeable. In FIGS. 11A-19B, the "A" figures are plan views (viewed from the above) and the "B" figures are cross sectional views corresponding to line L3-L3. Materials, configurations, dimensions, structures, conditions and operations the same as or similar to those explained with respect to FIGS. 1A-10D may be employed in the following embodiments, and some of the explanations may be omitted.

Figure 11A:
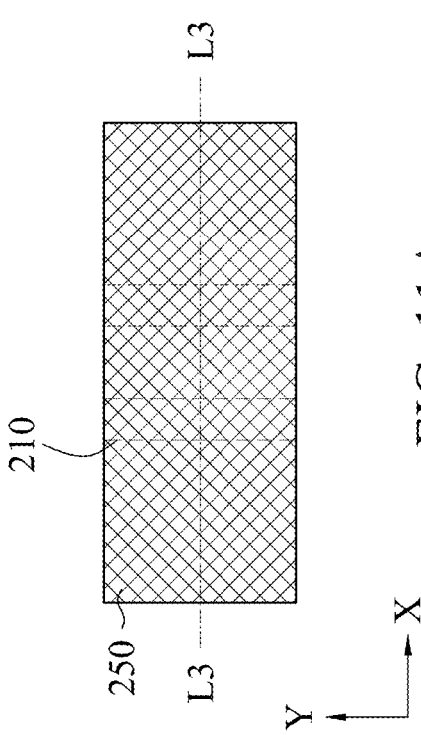
FIG. 11A illustrates a plan view of one of the various stages of manufacturing operations in accordance with an embodiment of the present disclosure.
Figure 11B:
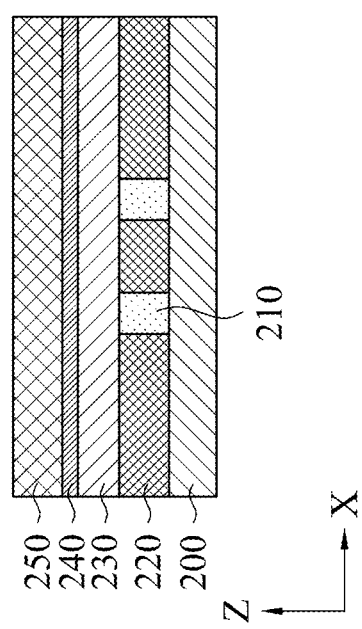
FIG. 11B illustrates a cross sectional view corresponding to line L3-L3 of FIG. 11A.

As shown in FIGS. 11A and 11B, an underlying structure is formed. In some embodiments, lower conductive patterns 210 are formed over a substrate 200. One or more layers may be disposed between the lower conductive patterns 210 and the substrate 200. The substrate 210 is the same as or similar to substrate 5 shown in FIGS. 2A and 2B. The conductive patterns 210 can be a diffusion region formed in the substrate, a gate electrode, a source and/or a drain, a metal wiring, or any conductive patterns formed in a semiconductor device.

In some embodiments, as shown in FIG. 11B, the lower conductive patterns 210 are formed (embedded) in a first dielectric layer 220. The first dielectric layer 220 includes one or more layers of silicon oxide, silicon nitride, SiON, SiCN, SiOC, SiOCN, low-k materials, organic material or any other suitable dielectric material.

Further, as shown in FIG. 11B, a second dielectric layer 230 is formed over the first dielectric layer 220. The second dielectric layer 230 includes one or more layers of silicon oxide, silicon nitride, SiON, SiCN, SiOC, SiOCN, low-k materials, organic material or any other suitable dielectric material. In some embodiments, the first dielectric layer 220 and the second dielectric layer 230 are made of the same material. In other embodiments, the first dielectric layer 220 and the second dielectric layer 230 are made of different materials. A first hard mask layer 240 is formed over the second dielectric layer 230 and a second hard mask layer 250 is formed over the first hard mask layer 240 in some embodiments. The first and second hard mask layers 240 and 250 are made of an insulating material in some embodiments.

In some embodiments, the first hard mask layer 240 includes one or more layers of AlN, aluminum oxide, AlON, hafnium oxide, zirconium oxide, silicon oxide, silicon nitride, SiON, SiCN, SiOC, SiOCN or any other suitable dielectric material. In some embodiments, the second hard mask layer 250 includes one or more layers of silicon oxide, silicon nitride, SiON, SiCN, SiOC, SiOCN or any other suitable dielectric material. In certain embodiments, TiN, TaN, or other metal nitride is used. In some embodiments, the materials of the first and second hard mask layers are different from each other. In certain embodiments, the materials of the first and second hard mask layers 240 and 250 and the second dielectric layer 230 are different from each other.

In some embodiments, the thickness of the second dielectric layer 230 is in a range from about 20 nm to about 200 nm, the thickness of the first hard mask layer 240 is in a range from about 5 nm to about 50 nm and the thickness of the second hard mask layer 250 is greater than the thickness of the first hard mask layer 240 and is in a range from about 20 nm to about 200 nm. These layers can be formed by physical vapor deposition (PVD), chemical vapor deposition (CVD), or atomic layer deposition (ALD), although any acceptable process may be utilized.

Figure 12A:
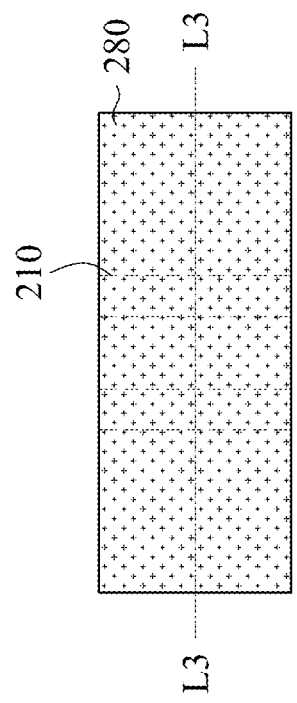
FIG. 12A illustrates a plan view of one of the various stages of manufacturing operations in accordance with an embodiment of the present disclosure.
Figure 12B:
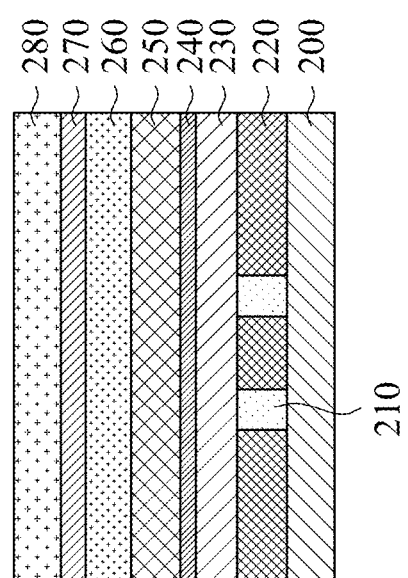
FIG. 12B illustrates a cross sectional view corresponding to line L3-L3 of FIG. 12A.

Then, as shown in FIGS. 12A and 12B, a tri-layer resist system is formed over the second hard mask layer 250. The tri-layer resist system includes a bottom layer 260, a middle layer 270 and a photo resist layer 280.

In some embodiments, the bottom layer 260 is made of an organic material. The organic material may include a plurality of monomers or polymers that are not cross-linked. Generally, the bottom layer 260 may contain a material that is patternable and/or have a composition tuned to provide anti-reflection properties. Exemplary materials for the bottom layer 30 include carbon backbone polymers, such as polyhydroxystyrene (PHS), poly methyl methacrylate (PMMA), polyether, and combinations thereof, and other organic polymers containing aromatic rings. The bottom layer 260 is used to planarize the structure, as the underlying structure may be uneven. In some embodiments, the bottom layer 260 is formed by a spin coating process. In other embodiments, the bottom layer 260 is formed by another suitable deposition process. The thickness of the bottom layer 260 is in a range from about 50 nm to about 200 nm in some embodiments and is in a range from about 80 nm to about 120 nm in other embodiments. In some embodiments, after the bottom layer 260 is formed, an annealing operation is performed. The middle layer 270 includes a silicon containing polymer, such as polysiloxane. The thickness of the middle layer 270 is in a range from about 10 nm to about 50 nm in some embodiments.

In the tri-layer resist patterning system, the photo resist layer 280 is patterned using one or more lithography operations, as shown FIGS. 13A and 13B. In some embodiments, hole patterns 290 having a diameter W31 are formed in the photo resist layer 280. Then, the middle layer 270 is etched by using the photo resist pattern 280 as an etching mask, and the bottom layer 260 is etched by using the patterned middle layer as an etching mask. Finally, the underlying layer to be patterned (e.g., the first and second hard mask layers 240 and 250 and the second dielectric layer 230) is etched by using the patterned middle layer, as shown in FIGS. 14A and 14B. In some embodiments, the bottom layer 260 is subsequently removed.

Figure 15A:
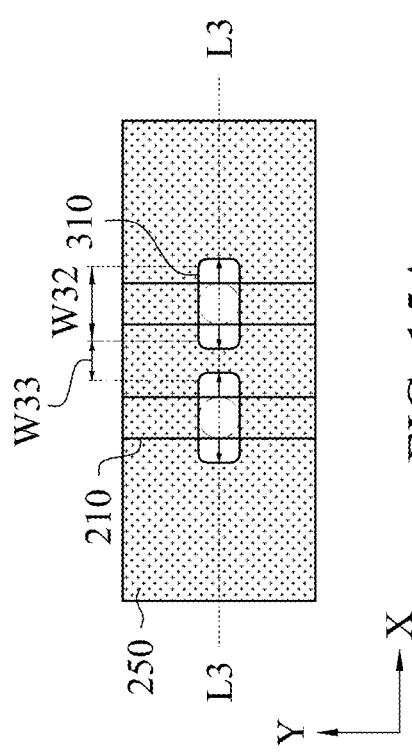
FIG. 15A illustrates a plan view of one of the various stages of manufacturing operations in accordance with an embodiment of the present disclosure.
Figure 15B:
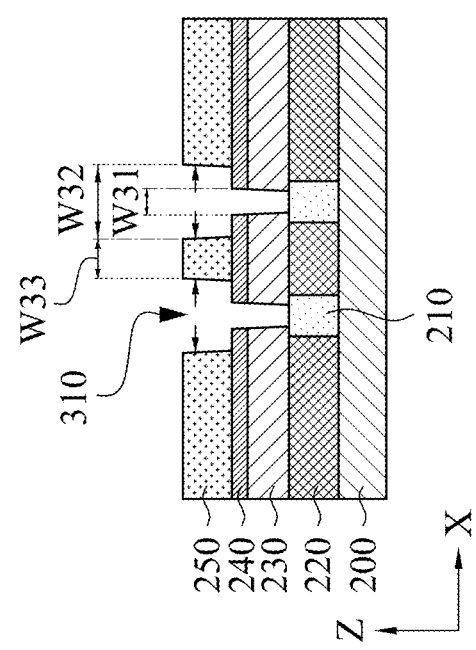
FIG. 15B illustrates a cross sectional view corresponding to line L3-L3 of FIG. 15A.

Then, as shown in FIGS. 15A and 15B, one or more directional etching operations along the X direction are performed to expand the hole shape patterns 290 to first groove patterns 310. As set forth above, in the directional etching, the original pattern (e.g., a hole pattern) is expanded substantially only along one axis (±X directions). In some embodiments, the etching gas (radicals) is selected to selectively etch the second hard mask layer 250 against the first hard mask layer 240 and the second dielectric layer 230. Accordingly, only the second hard mask layer 250 is expanded to form the first groove patterns 310 having a width W32. The directional etching is performed such that the space W33 between the adjacent first groove patterns 310 becomes a desired size, e.g., S11 as shown in FIG. 10A. In other embodiments, the directional etching is performed with bottom layer 260 remaining, and after the directional etching, the bottom layer 260 is removed.

Figure 16A:
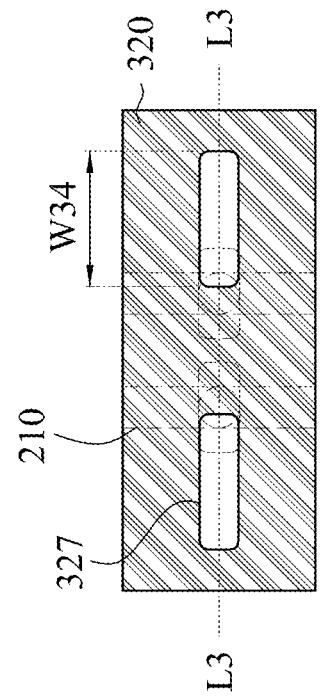
FIG. 16A illustrates a plan view of one of the various stages of manufacturing operations in accordance with an embodiment of the present disclosure.
Figure 16B:
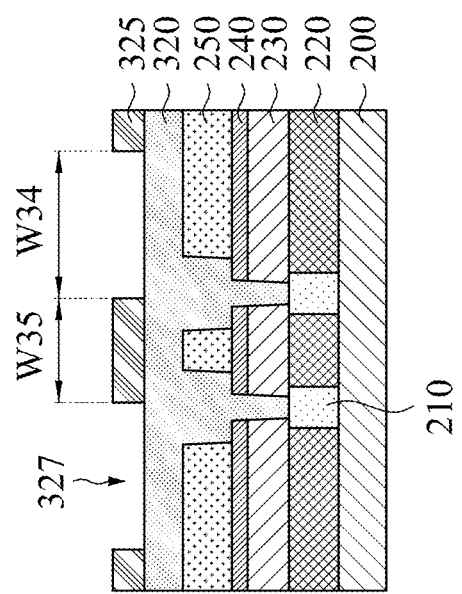
FIG. 16B illustrates a cross sectional view corresponding to line L3-L3 of FIG. 16A.

Subsequently, a lithography operation is performed to form second openings 330, such as second groove patterns as shown in FIGS. 16A and 16B. In some embodiments, the lithography operation employs a bi-layer resist system including a bottom layer 320 and a photo resist layer 325. The photo resist layer 325 includes a groove opening 327 only partially overlapping the first groove patterns 310 as shown in FIGS. 16A and 16B. The groove opening 327 has a length W34, corresponding to patterns 120A, 120B of FIG. 10D. Two adjacent groove openings 327 are spaced apart from each other by an amount W35, which is equal to or greater than the resolution limit of a single exposure lithography operation.

By using the photo resist pattern 325 as an etching mask, the bottom layer 320 is patterned as shown in FIGS. 17A and 17B. Accordingly, the resist pattern (mask pattern) 320 is formed by the bottom layer, e.g., an organic material layer, as set forth above. The second groove patterns 330 have a length W36 corresponding to patterns 120A, 120B of FIG. 10D, and only partially overlap the first groove patterns 310 as shown in FIGS. 17A and 17B. Thus, a part of the first groove pattern 310 is exposed in the second groove pattern 330.

In some embodiments, the resist pattern 320 fills the hole patterns 290 formed in the first hard mask layer 240 and the second dielectric layer 230. In such a case, the second groove patterns 330 do not overlap the hole patterns 290. In other embodiments, the second groove patterns 330 partially overlap the hole patterns 290. In other embodiments, a tri-layer resist system is used to form the resist pattern 320.

Then, one or more etching operations are performed on the second hard mask layer 250 using the resist pattern 320 as an etching mask. In some embodiments, one or more directional etching operations are performed to etch the second hard mask layer 250. Then, the resist pattern 320 is removed, thereby trench patterns 340 defined by the second hard mask layer 250 are formed, as shown in FIGS. 18A and 18B. The length W37 along the X direction of the trench pattern 340 is greater than at least one of W32 and W34 and smaller than W32+W34. As shown in FIGS. 18A and 18B, the via holes 290 are exposed in the trench patterns 340.

Figure 19A:
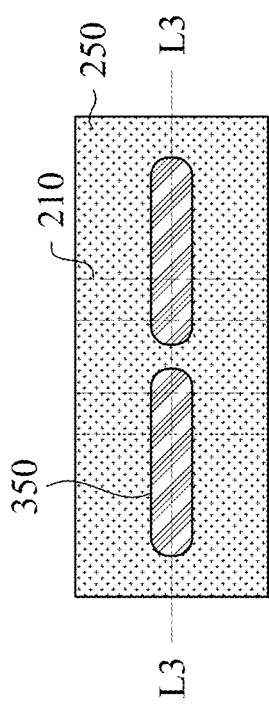
FIG. 19A illustrates a plan view of one of the various stages of manufacturing operations in accordance with an embodiment of the present disclosure.
Figure 19B:
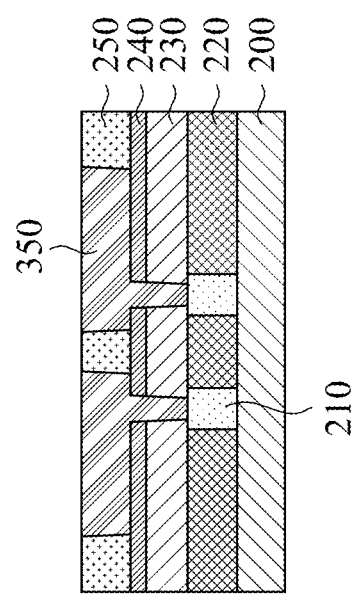
FIG. 19B illustrates a cross sectional view corresponding to line L3-L3 of FIG. 19A.

Subsequently, one or more layers of conductive material are formed in the via holes 290 and the trench patterns 340, and conductive patterns 350 are formed by using a damascene process, as shown in FIGS. 19A and 19B. The conductive material for the conductive patterns 350 is one or more selected from the group consisting of W, Cu, Ti, Ag, Al, TiAl, TiN, TaN, TiAlN, TaC, TaCN, TaSiN, Mn, Co, Pd, Ni, Re, Ir, Ru, Pt, and Zr, in some embodiments.

In some embodiments, when an etching selectivity in the directional etching between the second dielectric layer 230 and the second hard mask layer 250 is sufficiently high, no first hard mask layer 240 is necessary.

It is understood that the structure shown in FIGS. 19A and 19B undergoes further CMOS processes to form various features such as interconnect vias, interconnect metal layers, passivation layers, etc.

FIGS. 20A-20D shows plan views of one of the various stages for manufacturing a semiconductor device in accordance with other embodiments of the present disclosure. Materials, configurations, dimensions, structures, conditions and operations the same as or similar to those explained with respect to FIGS. 1A-19B may be employed in the following embodiments, and some of the explanations may be omitted.

Figure 20A:
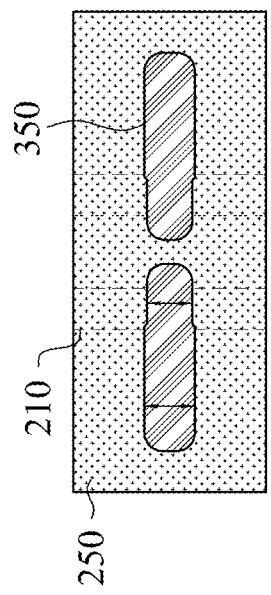
FIGS. 20A, 20B, 20C and 20D show plan views of one of the various stages of manufacturing operations in accordance with embodiments of the present disclosure.
Figure 20B:
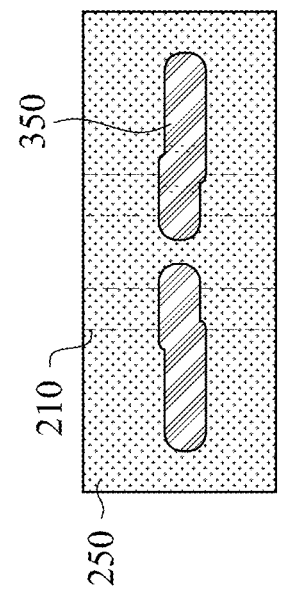

In the second lithography operation to form the groove openings 327 (the second groove patterns 330) as shown in FIGS. 16A and 16B and the subsequent etching operations, the width of the second groove patterns along the Y direction may not be equal to the width of the first groove patterns. When the width of the second groove patterns 330 is smaller than the width of the first groove patterns 310, the conductive patterns 350 have two-parts having different widths, as shown in FIG. 20A. Thus, the conductive pattern 350 has a step in the long side along the X direction. The amount of the step is in a range from about 0.5 nm to about 2 nm in some embodiments. The wider portion corresponding to the first groove patterns is located above the via holes 290. In contrast, when the width of the second groove patterns 330 is greater than the width of the first groove patterns 310, the conductive patterns 350 have two-parts having different widths, as shown in FIG. 20B. Thus, the conductive pattern 350 has a step in the long side along the X direction. The amount of the step is in a range from about 0.5 nm to about 2 nm in some embodiments. The wider portion corresponding to the second groove pattern overlaps the via hole in some embodiments.

Figure 20C:
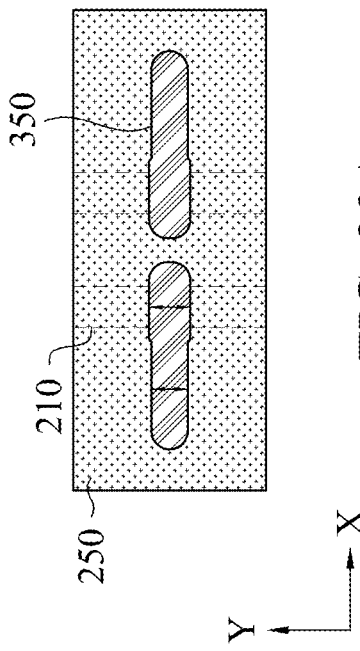
Figure 20D:
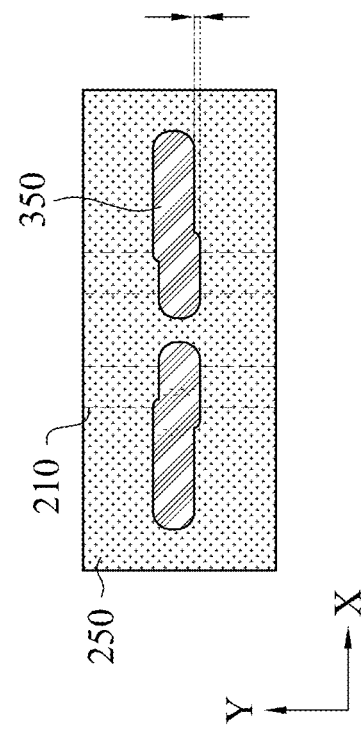

Further, in some embodiments, in the second lithography operation to form the groove openings 327 (second groove patterns 330) as shown in FIGS. 16A and 16B, the second groove patterns may not be completely aligned with the first groove patterns along the Y direction. In such a case, a center line of the first groove patterns along the X axis is not aligned, in the Y direction, with a center line of the second groove patterns. When the second groove patterns shifts along the +Y direction with respect to the first groove patterns, the conductive patterns 350 has a structure as shown in FIG. 20C, and when the second groove patterns shifts along the −Y direction with respect to the first groove patterns, the conductive patterns 350 has a structure as shown in FIG. 20D. Thus, the conductive pattern 350 has a step in the long side along the X direction. The amount of the step is in a range from about 0.5 nm to about 2 nm in some embodiments. The variation of the widths as shown in FIGS. 20A and 20B and the alignment error as shown in FIGS. 20C and 20D may occur at the same time in the same device.

FIGS. 21A-23B and FIGS. 24A-25B show various views of directional deposition operations according to embodiments of the present disclosure. It is understood that additional operations can be provided before, during, and after processes shown by FIGS. 21A-23B and FIGS. 24A-25B, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1A-20D may be employed in the following embodiments, and some of the explanations may be omitted. In FIGS. 21A-23B, the "A" figures are plan views (viewed from the above) and the "B" figures are cross sectional views corresponding to line L4-L4 of FIGS. 21A, 22A and 23A or line L5-L5 of FIGS. 24A and 25A.

Figure 21A:
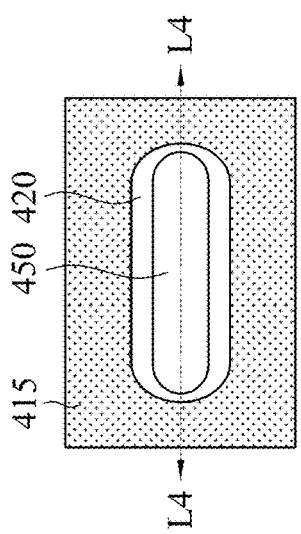
FIG. 21A illustrates a plan view of one of the various stages of manufacturing operations in accordance with an embodiment of the present disclosure.
Figure 21B:
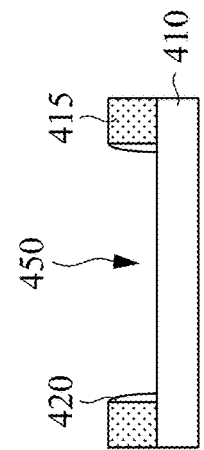
FIG. 21B illustrates a cross sectional view corresponding to line L4-L4 of FIG. 21A.

As shown in FIGS. 21A and 21B, a trench or an opening 450 is formed in the first layer 415 over a lower layer 410. The lower layer 410 is a dielectric layer in some embodiments, and is a conductive layer including a metallic layer, a polysilicon layer or a semiconductor substrate in other embodiments. The first layer 415 includes one or more layers of silicon oxide, silicon nitride, SiON, SiOC, SiOCN, SiCN, aluminum based dielectric material, metallic material (e.g., TiN, Ti, or TaN), or any other dielectric material used in a semiconductor device fabrication. The first layer 415 can be formed by PVD, CVD, or ALD, although any acceptable process may be utilized.

Then, the dimension of the opening 450 is reduced by one or more directional deposition operations. Similar to a directional etching operation, by tuning various deposition parameters to generate depositing species (radicals, molecules, atoms, etc) that travel in a substantially horizontal direction or incident on the substrate with a large incident angle of more than about 70 degrees (where the angle of 90 degrees is horizontal). The deposition parameters to be tuned include, but are not limited to, deposition gas composition, deposition temperature, deposition time, deposition pressure, radio frequency (RF) bias voltage, RF bias power, gas flow rate, wafer tilting, other suitable parameters, or combinations thereof.

Figure 22A:
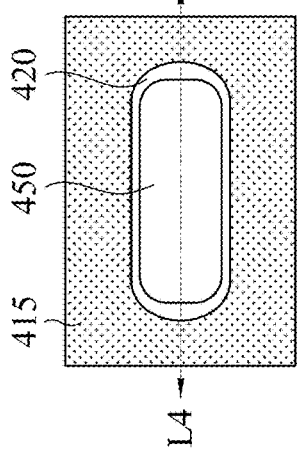
FIG. 22A illustrates a plan view of one of the various stages of manufacturing operations in accordance with an embodiment of the present disclosure.
Figure 22B:
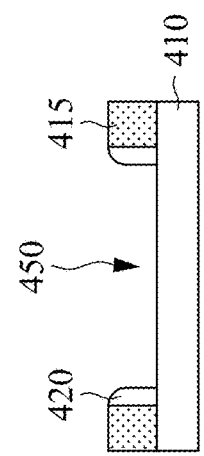
FIG. 22B illustrates a cross sectional view corresponding to line L4-L4 of FIG. 22A.

As shown in FIGS. 22A and 22B, the directional deposition operations are performed in the ±X directions. An amount of a deposited material 420 at ends of the opening 450 in the X direction is greater than an amount of a deposited material 420 at ends of the opening 450 in the Y direction. In some embodiments, the amount of the deposited material 420 at ends of the opening 450 in the X direction is twice or more, five times or more, or ten times or more (up to 100 times) the amount of the deposited material 420 at ends of the opening 450 in the Y direction.

Figure 23A:
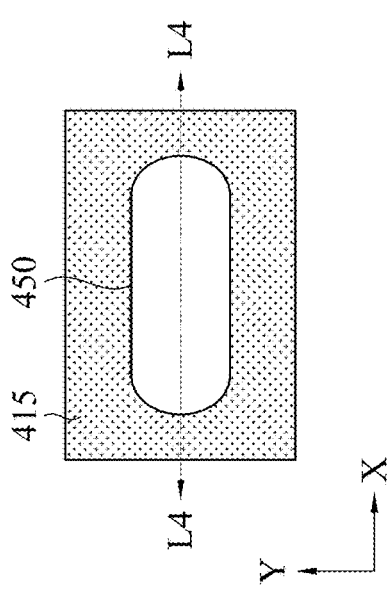
FIG. 23A illustrates a plan view of one of the various stages of manufacturing operations in accordance with an embodiment of the present disclosure.
Figure 23B:
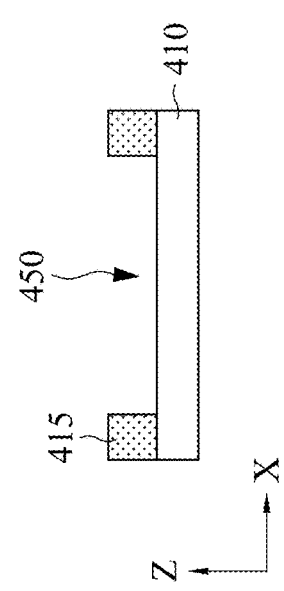
FIG. 23B illustrates a cross sectional view corresponding to line L4-L4 of FIG. 23A.

FIGS. 23A and 23B show the case of the directional deposition operations in the ±Y directions. An amount of a deposited material 420 at ends of the opening 450 in the Y direction is greater than an amount of a deposited material 420 at ends of the opening 450 in the X direction. In some embodiments, the amount of the deposited material 420 at ends of the opening 450 in the Y direction is twice or more, five times or more, or ten times or more (up to 100 times) the amount of the deposited material 420 at ends of the opening 450 in the X direction.

By a directional deposition operation or the combination of directional deposition and etching operations, it is possible to precisely adjust the dimensions of the openings in either or both of the X and/or Y directions. For example, the corner shape of the openings can be modified to have a smaller corner rounding, and the width of the opening (trench) can be reduced without substantially reducing the length of the trench.

Figure 24A:
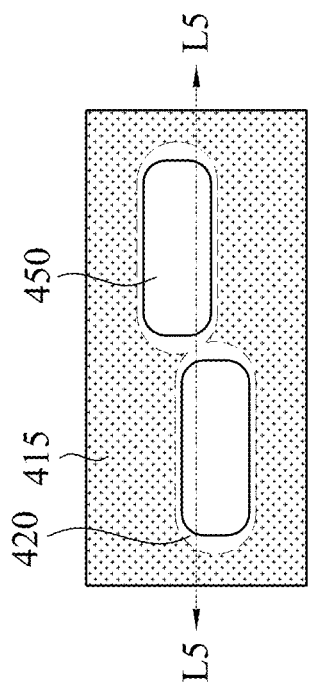
FIG. 24A illustrates a plan view of one of the various stages of manufacturing operations in accordance with an embodiment of the present disclosure.
Figure 24B:
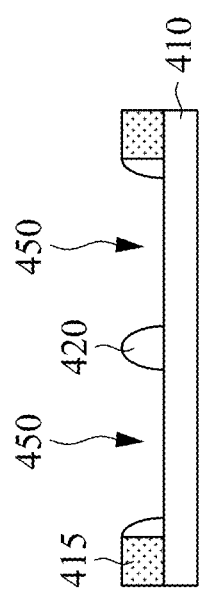
FIG. 24B illustrates a cross sectional view corresponding to line L5-L5 of FIG. 24A.
Figure 25A:
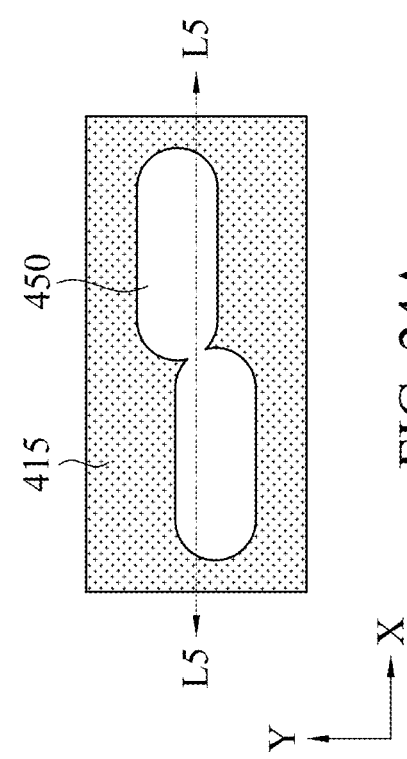
FIG. 25A illustrates a plan view of one of the various stages of manufacturing operations in accordance with an embodiment of the present disclosure.
Figure 25B:
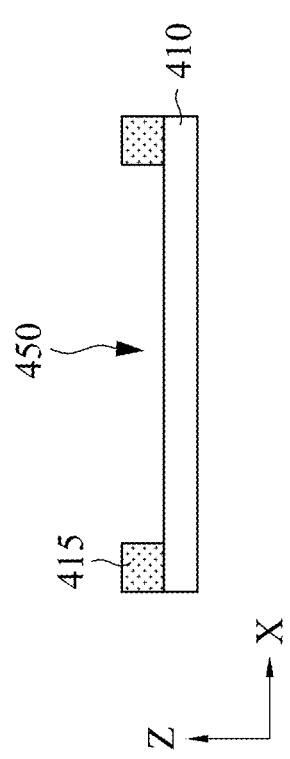
FIG. 25B illustrates a cross sectional view corresponding to line L5-L5 of FIG. 25A.

In FIGS. 24A to 25B, the directional deposition operations are used to repair pattern defects. As shown in FIGS. 24A and 24B, two openings 450 are merged due to over-etching in some embodiments. By applying one or more directional etching in the X direction, the bridged portion is separated by a deposited material 420, as shown in FIGS. 25A and 25B.

Figure 26A:
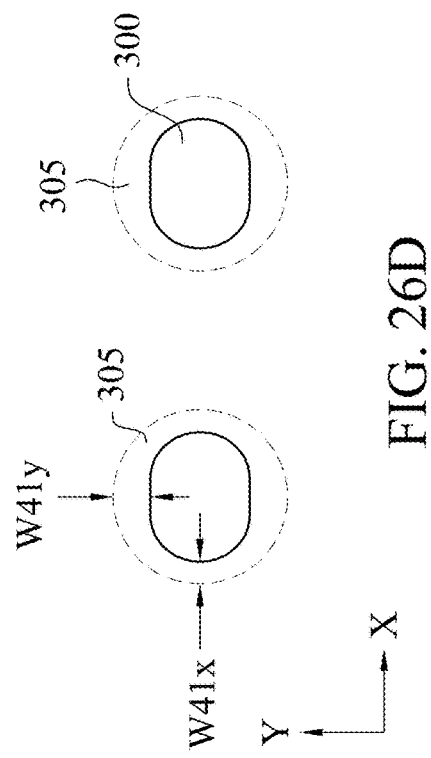
FIG. 26A illustrates a plan view of one of the various stages of manufacturing operations in accordance with an embodiment of the present disclosure.
Figure 26B:
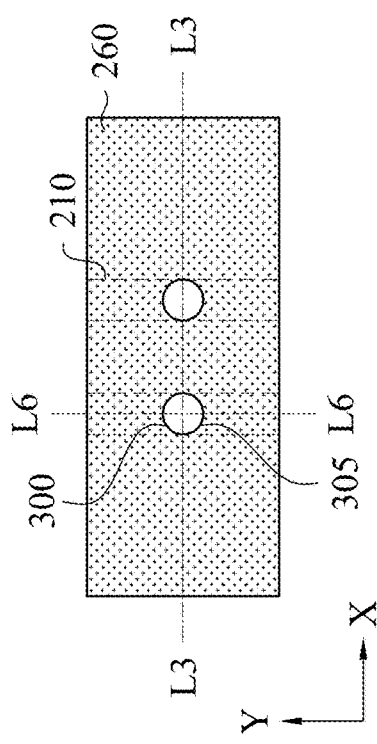
FIG. 26B illustrates a cross sectional view corresponding to line L3-L3 of FIG. 26A.
Figure 26D:
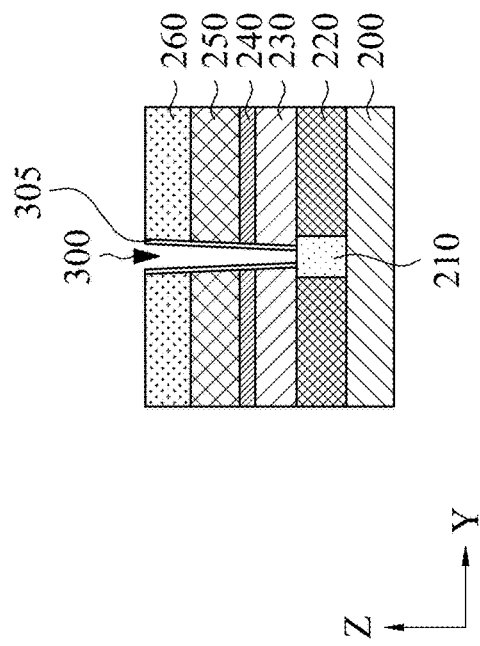
FIG. 26D is an enlarged view of a part of FIG. 26A.
Figure 26C:
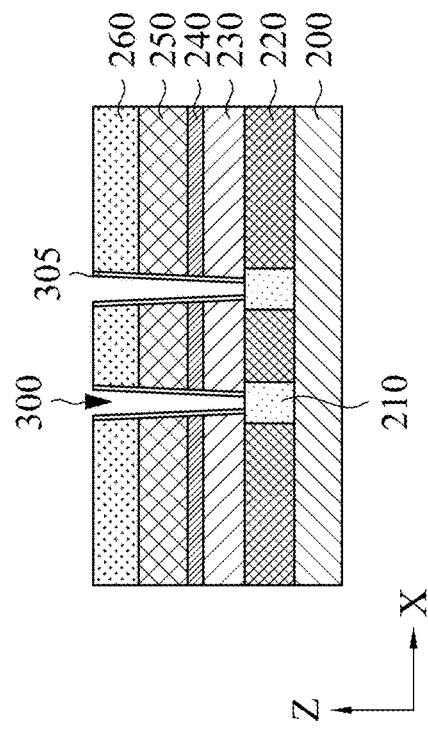
FIG. 26C illustrates a cross sectional view corresponding to line L6-L6 of FIG. 26A.

FIGS. 26A-28B show various views of directional deposition operations according to embodiments of the present disclosure. It is understood that additional operations can be provided before, during, and after processes shown by FIGS. 26A-28B, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1A-25B may be employed in the following embodiments, and some of the explanations may be omitted. In FIGS. 26A-28B, the "A" figures are plan views (viewed from the above) and the "B" figures are cross sectional views corresponding to line L3-L3 of FIGS. 26A, 27A and 28A. FIG. 26C is a cross sectional view corresponding to lines L6-L6 of FIG. 26A and FIG. 26D is an enlarged view of a part of FIG. 26A.

After the structure shown in FIGS. 14A and 14B is formed, one or more directional deposition operations as set forth above are performed to form a sacrificial layer 305 in the hole pattern 300, as shown in FIGS. 26A-26D. The sacrificial layer 305 is made of one or more of silicon oxide, silicon nitride, SiON, SiOCN, SiON, SiCN, organic material, or any other suitable dielectric or conductive materials. The thickness $W41y$ of the sacrificial layer 305 in the Y direction is greater than the thickness $W41x$ of the sacrificial layer 305 in the X direction.

Figure 27A:
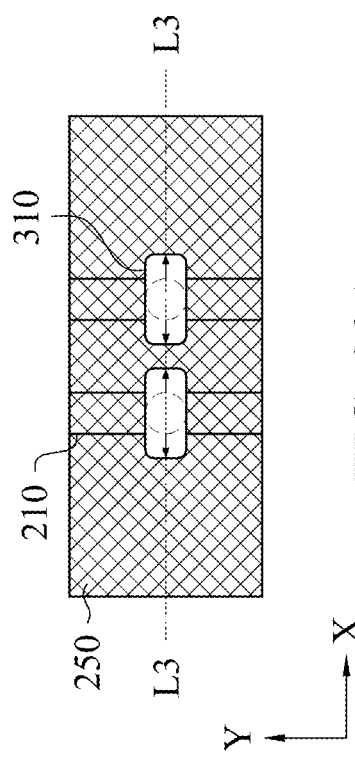
FIG. 27A illustrates a plan view of one of the various stages of manufacturing operations in accordance with an embodiment of the present disclosure.
Figure 27B:
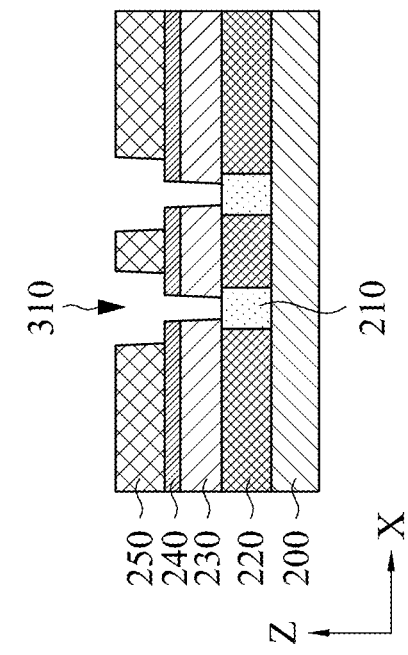
FIG. 27B illustrates a cross sectional view corresponding to line L3-L3 of FIG. 27A.
Figure 28A:
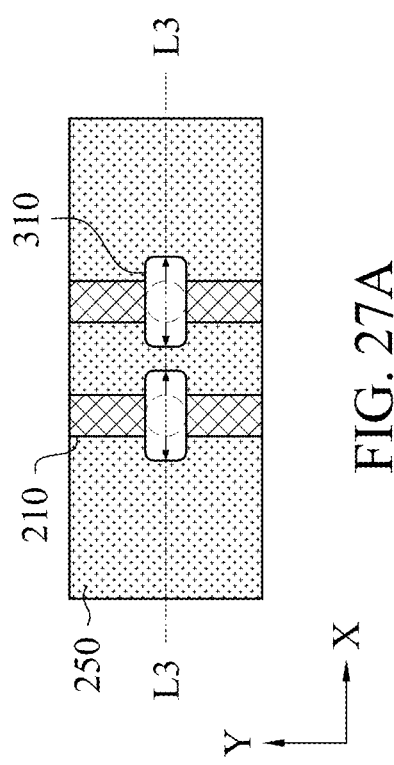
FIG. 28A illustrates a plan view of one of the various stages of manufacturing operations in accordance with an embodiment of the present disclosure.
Figure 28B:
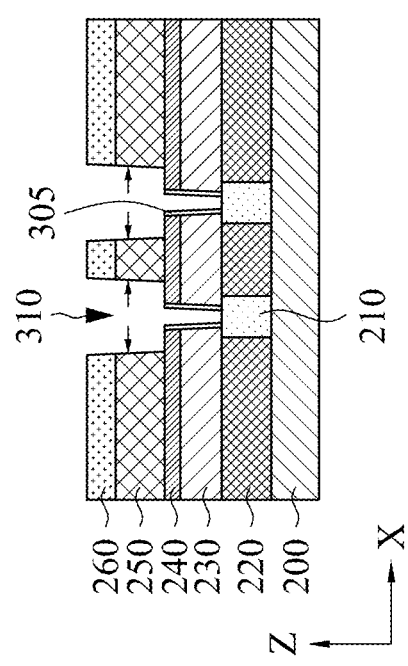
FIG. 28B illustrates a cross sectional view corresponding to line L3-L3 of FIG. 28A.

Then, one or more directional etching operations are performed to expand the hole pattern 300 in the X direction as shown in FIGS. 27A and 27B. Due to the thicker sacrificial layer 305 in the Y direction, etching of the Y direction is suppressed in the directional etching. Accordingly, the first groove patterns 310 can be formed with desired dimensions. At this stage, the sacrificial layer 305 remains at the bottom of the hole patterns in the first hard mask layer 240 and the second dielectric layer 230. Subsequently, the bottom layer 260 and the sacrificial layer 305 are removed, as shown in FIGS. 28A and 28B. Then, the operations explained with respect to FIGS. 16A-19B are performed to form conductive patterns 350.

As set forth above, by using one or more directional etching operations with two lithography operations, it is possible to obtain patterns having smaller separation than the resolution limit of a lithography operation with a single exposure.

It will be understood that not all advantages have been necessarily discussed herein, no particular advantage is required for all embodiments or examples, and other embodiments or examples may offer different advantages.

In accordance with an aspect of the present disclosure, in a pattern forming method for a semiconductor device, a first opening is formed in an underlying layer disposed over a substrate. The first opening is expanded in a first axis by directional etching to form a first groove in the underlying layer. A resist pattern is formed over the underlying layer. The resist pattern includes a second opening only partially overlapping the first groove. The underlying layer is patterned by using the resist pattern as an etching mask to form a second groove. In one or more of the foregoing and following embodiments, in the expanding the first opening, an expanding amount in one direction along the first axis is equal to an extending amount in another direction opposite to the one direction along the first axis. In one or more of the foregoing and following embodiments, in the directional etching, an etching rate of the underlying layer along the first axis is greater than an etching rate of the underlying layer along a second axis perpendicular to the first axis. In one or more of the foregoing and following embodiments, the etching rate of the underlying layer along the first axis is twice or more the etching rate of the underlying layer along the second axis perpendicular to the first axis. In one or more of the foregoing and following embodiments, the underlying layer includes a first layer and a second layer formed over the first layer, the first opening is formed in the first layer and the second layer, and in the patterning the underlying layer, the second layer is patterned to form the second groove in the second layer. In one or more of the foregoing and following embodiments, the first layer and the second layer are made of different dielectric material from each other. In one or more of the foregoing and following embodiments, the resist pattern fills the first opening formed in the first layer so that the second opening does not overlap the first opening formed in the first layer. In one or more of the foregoing and following embodiments, the first opening has a circular shape in plan view.

In accordance with another aspect of the present disclosure, in a method of manufacturing a semiconductor device, a first underlying layer is formed over a substrate and a second underlying layer is formed over the first underlying layer. A first opening and a second opening are formed in the first and second underlying layers. The first opening and the second opening are expanded in a first axis by directional etching to form a first groove and a second groove in the second underlying layer. A resist pattern is formed. The resist pattern includes a third opening only partially overlapping the first groove and a fourth opening only partially overlapping the second groove. The second underlying layer is patterned by using the resist pattern as an etching mask to form a first trench and a second trench in the second underlying layer. The first and second openings formed in the first underlying layer and the first and second trenches formed in the second underlying layer are filled with conductive material. In one or more of the foregoing and following embodiments, in the directional etching, an etching rate of the second underlying layer along the first axis is greater than an etching rate of the underlying layer along a second axis perpendicular to the first axis. In one or more of the foregoing and following embodiments, the etching rate of the underlying layer along the first axis is five to twenty times the etching rate of the underlying layer along the second axis. In one or more of the foregoing and following embodiments, the first opening and the second opening are spaced apart from each other by an amount of S1, and the first groove and the second groove are spaced apart from each other by an amount of S2, where S1>S2. In one or more of the foregoing and following embodiments, the third opening and the fourth opening are spaced apart from each other by an amount of S3, where S3>S2. In one or more of the foregoing and following embodiments, S3>S1. In one or more of the foregoing and following embodiments, the first layer is formed over a third layer disposed over the substrate, a first conductive pattern and a second conductive pattern are formed in the third layer, and the first opening is formed on the first conductive pattern and the second opening is formed on the second conductive pattern. In one or more of the foregoing and following embodiments, the first layer and the second layer are made of different dielectric material from each other. In one or more of the foregoing and following embodiments, the resist pattern fills the first and second openings formed in the first layer so that the third and fourth openings do not overlap the first and second openings formed in the first layer, respectively. In one or more of the foregoing and following embodiments, a center line of the third opening along the first axis is not aligned, in the second direction, with a center line of the first groove along the first axis.

In accordance with another aspect of the present disclosure, in a method of manufacturing a semiconductor device, a first underlying layer is formed over a substrate and a second underlying layer is formed over the first underlying layer. A first resist pattern having a first opening and a second opening are formed over the second underlying layers. The first and second underlying layers are patterned by using the first resist pattern as an etching mask, thereby forming a third opening and a fourth opening in the first and second underlying layers. The third opening and the fourth opening are expanded in a first axis by directional etching to form a first groove and a second groove in the second underlying layer. A second resist pattern is formed. The second resist pattern includes a fifth opening only partially overlapping the first groove and a sixth opening only partially overlapping the second groove. The second underlying layer is patterned by using the second resist pattern as an etching mask to form a first trench and a second trench in the second underlying layer. The first opening and the second opening are spaced apart from each other by an amount of S1, and the first trench and the second trench are spaced apart from each other by an amount of S2, where S1>S2. In one or more of the foregoing and following embodiments, S1 is equal to or greater than a minimum space patternable in a single lithography process used to form the first resist pattern.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a first underlying layer over a substrate;
    forming a second underlying layer over the first underlying layer;
    forming a first resist pattern having a first opening over the second underlying layer;
    patterning the first and second underlying layers by using the first resist pattern as an etching mask, thereby forming a second opening in the first and second underlying layers;
    expanding the second opening in a first axis by directional etching of the second underlying layer to form a first groove in the second underlying layer so that a part of an upper surface of the first underlying layer is exposed around the second opening in the first underlying layer;
    forming a second resist pattern including a fourth opening partially overlapping the first groove; and
    patterning the second underlying layer by using the second resist pattern as an etching mask to form a first trench in the second underlying layer.

2. The method of claim 1, wherein in the directional etching, an etching rate of the second underlying layer along the first axis is greater than an etching rate of the second underlying layer along a second axis perpendicular to the first axis.

3. The method of claim 2, wherein the etching rate of the second underlying layer along the first axis is twice or more the etching rate of the second underlying layer along the second axis perpendicular to the first axis.

4. The method of claim 1, wherein a width of the first trench is greater than a width of the first groove in the first axis.

5. The method of claim 4, wherein a width of the second opening at the upper surface of the first underlying layer is smaller than the width of the first trench.

6. The method of claim 1, wherein the first underlying layer includes a first layer and a second layer formed over the first layer and made of a different material than the first layer.

7. The method of claim 6, wherein the first layer includes one or more of silicon oxide, silicon nitride, SiON, SiCN, SiOC or SiOCN.

8. The method of claim 6, wherein the second layer includes one or more of AlN, aluminum oxide, AlON, hafnium oxide or zirconium oxide.

9. The method of claim 6, wherein the second underlying layer includes one or more of silicon oxide, silicon nitride, SiON, SiCN, SiOC or SiOCN.

10. The method of claim 6, wherein the second underlying layer includes one or more of TiN or TaN.

11. The method of claim 1, wherein the second resist pattern fills the second opening formed in the first underlying layer.

12. A method for manufacturing a semiconductor device, the method comprising:
    forming an underlying conductive pattern in a dielectric layer over a substrate;
    forming an underlying layer over the underlying conductive pattern and the dielectric layer;
    forming a first opening in an underlying layer;
    expanding an upper portion of the first opening in a first axis by directional etching to form a first groove in an upper portion of the underlying layer;
    forming a resist pattern over the underlying layer, the resist pattern including a second opening partially overlapping the first groove;
    patterning the upper portion of the underlying layer by using the resist pattern as an etching mask to form a second groove; and
    filling a conductive material in the second groove and a lower portion of the first opening in a lower portion of the underlying layer to connect the underlying conductive pattern.

13. The method of claim 12, wherein the forming the resist pattern comprises:

forming a first resist layer over the underlying layer to fill the lower portion of the first opening and the expanded upper portion of the first opening;

forming a second resist layer having an opening corresponding to the second opening over the first resist layer;

patterning the first resist layer by using the second resist layer as an etching mask; and removing the second resist layer.

14. The method of claim 12, further comprising, before expanding the upper portion of the first opening, forming a sacrificial layer on an inner wall of the first opening by a directional deposition method.

15. The method of claim 12, wherein, when viewed from above, a width of the conductive material above the first opening is smaller than a width of the conductive material above a location other than the first opening.

16. A method of manufacturing a semiconductor device, the method comprising:

forming a conductive pattern layer having a conductive pattern over a substrate;

forming a first underlying layer over the conductive pattern layer;

forming a second underlying layer over the first underlying layer;

forming a tri-layer resist over the second underlying layer;

forming a first opening in the tri-layer resist to expose the second underlying layer;

patterning the first and second underlying layers by using the first opening as an etching mask, thereby forming a second opening in the first and second underlying layers exposing the conductive pattern;

expanding the second opening in a first axis by directional etching of the second underlying layer to form a first groove in the second underlying layer so that a part of an upper surface of the first underlying layer is exposed around the second opening in the first underlying layer;

forming a second resist layer over the conductive pattern, the first underlying layer, and the second underlying layer;

patterning the second resist layer to form a second resist pattern including a fourth opening partially overlapping the first groove; and patterning the second underlying layer by using the second resist pattern as an etching mask to form a first trench in the second underlying layer.

17. The method of claim 16, wherein in the directional etching, an etching rate of the second underlying layer along the first axis is greater than an etching rate of the second underlying layer along a second axis perpendicular to the first axis.

18. The method of claim 17, wherein the etching rate of the second underlying layer along the first axis is twice or more the etching rate of the second underlying layer along the second axis perpendicular to the first axis.

19. The method of claim 16, wherein a width of the first trench is greater than a width of the first groove in the first axis.

20. The method of claim 19, wherein a width of the second opening at the upper surface of the first underlying layer is smaller than the width of the first trench.

* * * * *